US010229966B2

(12) United States Patent
Dahlström et al.

(10) Patent No.: US 10,229,966 B2
(45) Date of Patent: Mar. 12, 2019

(54) SEMICONDUCTOR RESISTOR STRUCTURE AND METHOD FOR MAKING

(71) Applicant: Texas Instruments Incorporated, Dallas, TX (US)

(72) Inventors: Mattias Erik Dahlström, Los Altos, CA (US); Li Jen Choi, Milpitas, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/419,002

(22) Filed: Jan. 30, 2017

(65) Prior Publication Data
US 2018/0190753 A1   Jul. 5, 2018

Related U.S. Application Data

(60) Provisional application No. 62/440,614, filed on Dec. 30, 2016.

(51) Int. Cl.
*H01L 49/02* (2006.01)
*H01L 21/027* (2006.01)
*H01L 21/3205* (2006.01)

(52) U.S. Cl.
CPC .......... *H01L 28/20* (2013.01); *H01L 21/0273* (2013.01); *H01L 21/32053* (2013.01); *H01L 21/32055* (2013.01); *H01L 28/24* (2013.01)

(58) Field of Classification Search
CPC ............. H01L 21/76895; H01L 27/124; H01L 27/0629; H01L 23/528; H01L 28/20; H01L 28/24; H01L 21/2851; H01L 27/0802; H01L 29/0649; H01L 29/456; H01L 29/665; H01L 21/0273; H01L 21/31053; H01L 21/32055
See application file for complete search history.

(56) References Cited

U.S. PATENT DOCUMENTS

| 5,656,524 A | 8/1997 | Eklund et al. |
| 5,682,060 A | 10/1997 | Tung et al. |
| 6,727,133 B1 | 4/2004 | Baldwin |
| 8,748,256 B2 | 6/2014 | Zhao et al. |

(Continued)

FOREIGN PATENT DOCUMENTS

CN   104064520 A   *   9/2014   ......... H01L 21/8222

*Primary Examiner* — Caridad Everhart
(74) *Attorney, Agent, or Firm* — Rose Alyssa Keagy; Charles A. Brill; Frank D. Cimino

(57) ABSTRACT

Disclosed examples include a resistor comprising a semiconductor structure having a length dimension with first and second ends spaced from one another and an intermediate region between the first and second ends, first and second metal-semiconductor compound structures on the semiconductor structure proximate the first and second ends of the semiconductor structure, the first and second metal-semiconductor compound structures being spaced apart from each other along the length dimension of the semiconductor structure, and at least one intermediate metal-semiconductor compound structure on a portion of the intermediate region of the semiconductor structure between the first and second ends, the intermediate metal-semiconductor compound structure being spaced apart from the first and second metal-semiconductor compound structures on the semiconductor structure.

20 Claims, 8 Drawing Sheets

(56) References Cited

U.S. PATENT DOCUMENTS

| | | | |
|---|---|---|---|
| 2003/0178697 A1* | 9/2003 | Lee | H01L 27/0802 257/536 |
| 2005/0248977 A1* | 11/2005 | Liaw | G11C 11/4125 365/154 |
| 2006/0177978 A1* | 8/2006 | Tsutsumi | H01L 27/105 438/238 |
| 2007/0096183 A1* | 5/2007 | Ogawa | H01L 27/0629 257/300 |
| 2008/0030297 A1 | 2/2008 | Ohtsuka et al. | |
| 2008/0054405 A1 | 3/2008 | Wang et al. | |
| 2008/0217741 A1* | 9/2008 | Young | H01L 29/8605 257/538 |
| 2012/0098071 A1 | 4/2012 | Aggarwal et al. | |
| 2012/0126370 A1* | 5/2012 | Harmon | H01L 23/3677 257/536 |
| 2013/0307074 A1 | 11/2013 | Cheng et al. | |
| 2013/0320497 A1* | 12/2013 | Zhang | H01L 27/101 257/538 |
| 2014/0035061 A1 | 2/2014 | Aggarwal et al. | |
| 2014/0183657 A1 | 7/2014 | Lim et al. | |
| 2015/0187759 A1 | 7/2015 | Aggarwal et al. | |
| 2016/0247875 A1 | 8/2016 | Aggarwal et al. | |
| 2017/0011826 A1* | 1/2017 | Hiroshima | H01C 7/06 |

\* cited by examiner

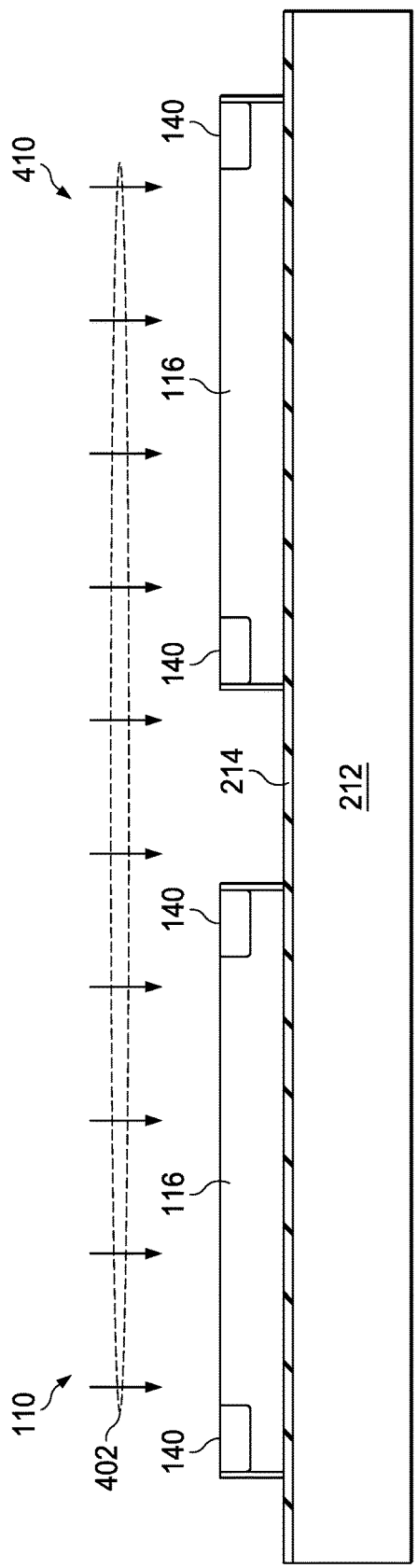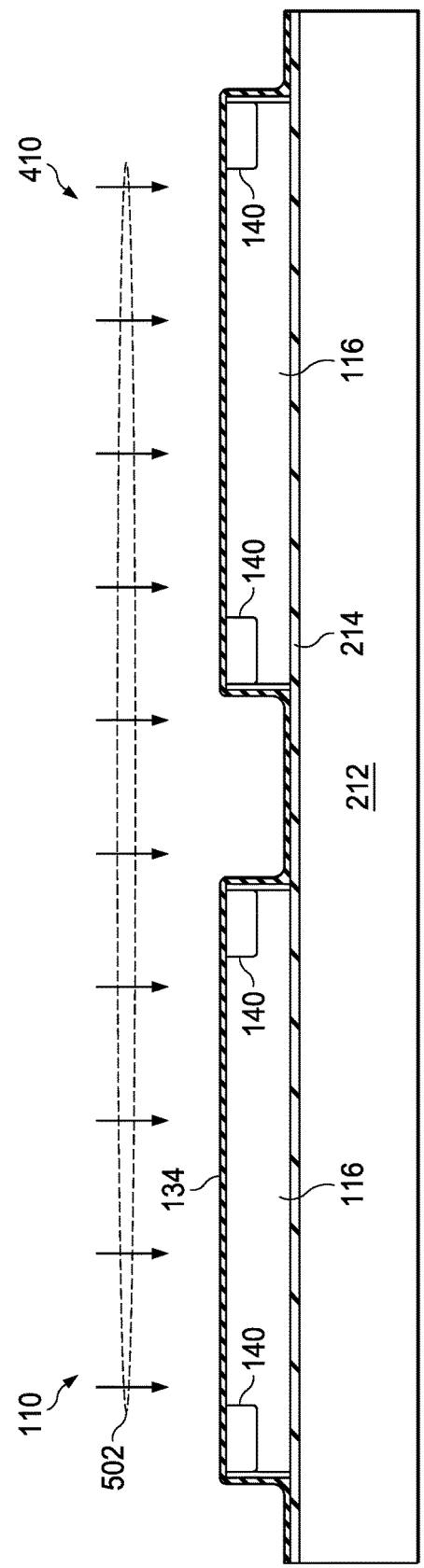

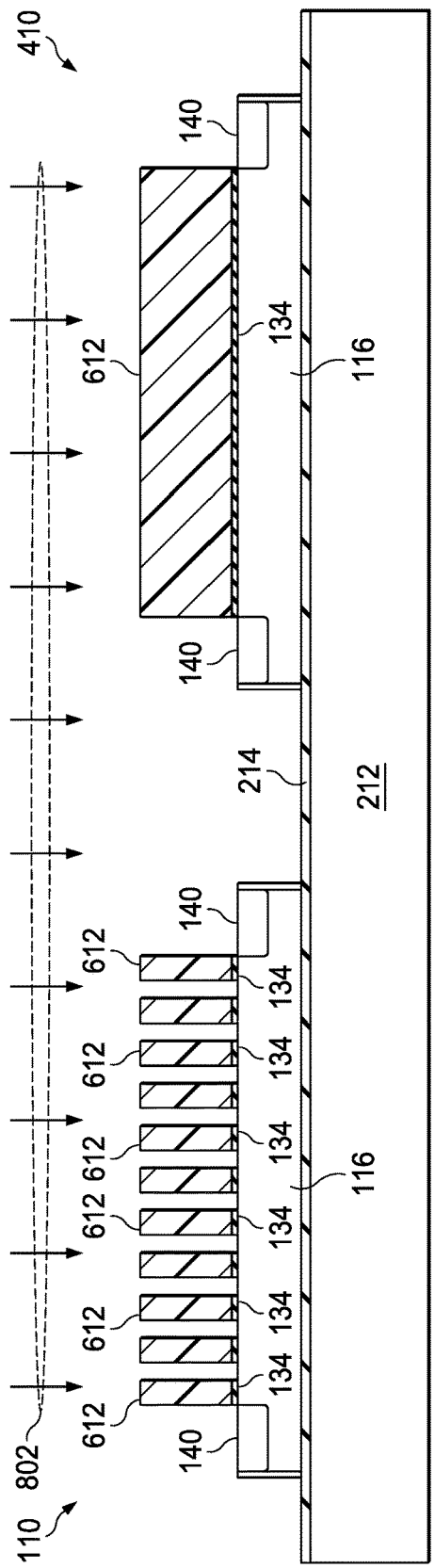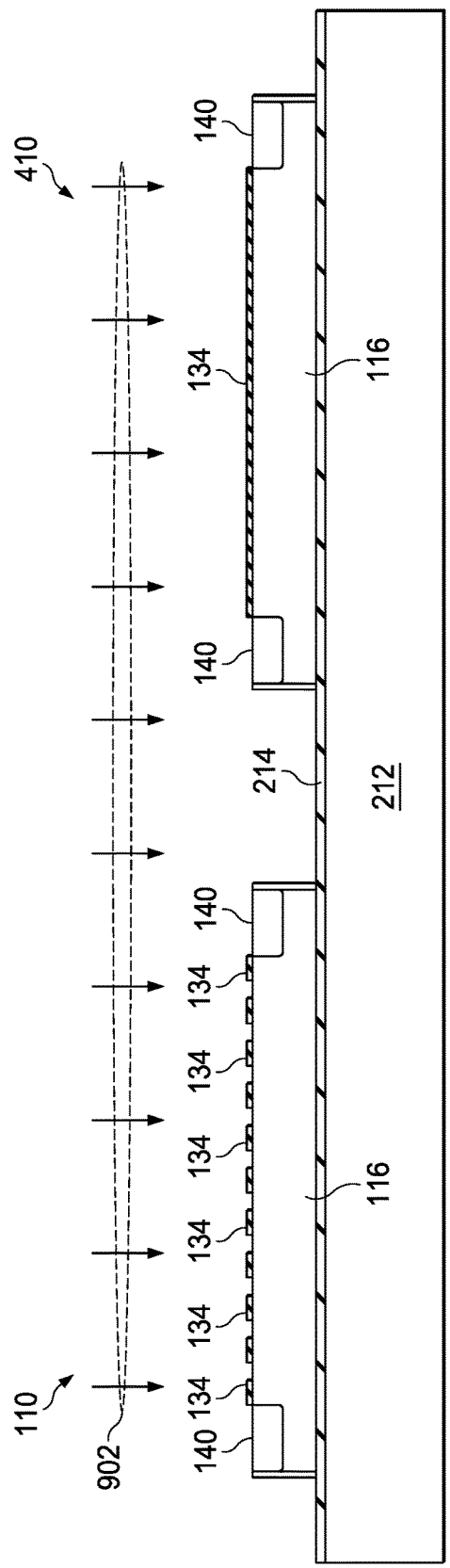

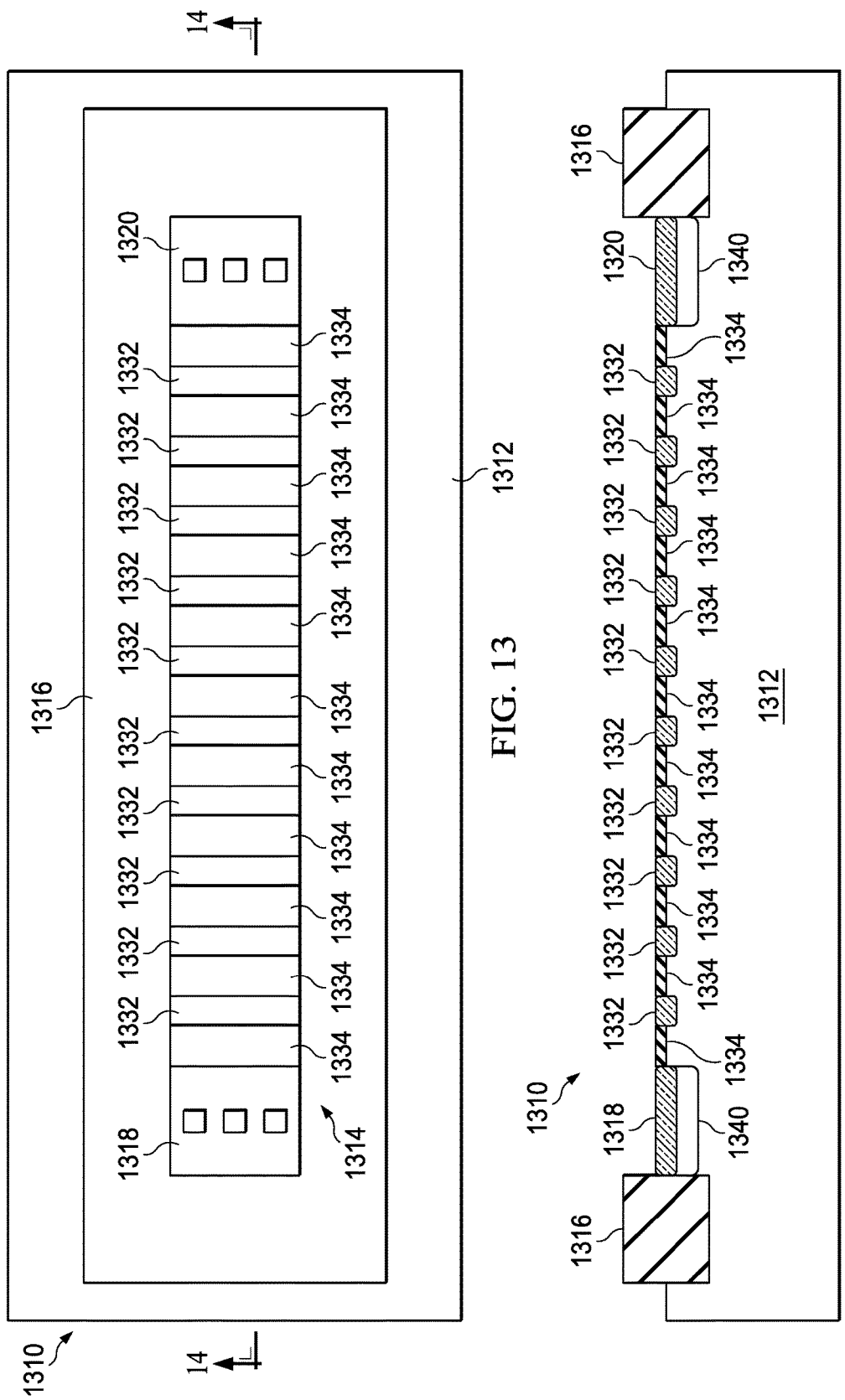

SEMICONDUCTOR RESISTOR STRUCTURE AND METHOD FOR MAKING

REFERENCE TO RELATED APPLICATION

Under 35 U.S.C. § 119, this application claims priority to, and the benefit of, U.S. provisional patent application No. 62/440,614, entitled "SEMICONDUCTOR RESISTOR STRUCTURE AND METHOD FOR MAKING", and filed on Dec. 30, 2016, the entirety of which is hereby incorporated by reference.

BACKGROUND

Conventional polysilicon resistors in semiconductor processes can have a wide range of values for their temperature coefficient of resistance (TCR), from positive to negative, whereas diffused resistors in monocrystalline silicon typically have a positive TCR. For many device applications, resistors with small or zero TCR are desired. Examples of device applications wherein low or zero TCR resistors are often desirable include voltage dividers, amplifier gains and/or other devices wherein reference voltage is used. In the past, resistors with small or zero TCR have been fabricated using relatively expensive materials and/or with additional processing steps that add complexity to fabrication. In certain applications, controlled TCR is important, even if the TCR is nonzero.

SUMMARY

The present disclosure sets forth a device in the form of a resistor, and a method for making the same, having a small or zero TCR without the use of relatively expensive materials and/or fabrication techniques. In one embodiment, an example resistor is fabricated alongside and/or in conjunction with other integrated circuit components on a wafer using fabrication steps and materials already used in fabrication of the other integrated circuit components on a given wafer. As such, aspects of the present disclosure provide for the fabrication of low or zero TCR resistors with virtually no additional cost or processing steps. Also disclosed is a method of lowering the TCR of a resistor, whether the TCR of the base resistor material has a positive or negative TCR.

Disclosed examples include a resistor comprising a semiconductor structure between the first and second ends. The resistor also includes first and second metal-semiconductor compound structures on the semiconductor structure proximate the first and second ends of the semiconductor structure, where the first and second metal-semiconductor compound structures are spaced apart from each other along the length dimension of the semiconductor structure. The resistor further includes at least one intermediate metal-semiconductor compound structure on a portion of the intermediate region of the semiconductor structure between the first and second ends, where the intermediate metal-semiconductor compound structure is spaced apart from the first and second metal-semiconductor compound structures on the semiconductor structure.

Another example resistor includes a resistor region of a semiconductor substrate. The resistor region has a length dimension with first and second ends spaced from one another and an intermediate region between the first and second ends. The resistor further includes an oxide structure formed on or in the semiconductor substrate surrounding the resistor region of the semiconductor substrate, as well as first and second metal-semiconductor compound structures on the first and second ends of the resistor region, where the first and second metal-semiconductor compound structures are spaced apart from each other along the length dimension of the resistor region. The resistor also includes at least one intermediate metal-semiconductor compound structure on a portion of the intermediate region of the resistor region between the first and second ends, where the intermediate metal-semiconductor compound structure is spaced apart from the first and second metal-semiconductor compound structures on the resistor region of the semiconductor substrate.

BRIEF DESCRIPTION OF THE DRAWINGS

FIG. 4 is a side elevation view of first and second resistors in a partially fabricated state including a polysilicon layer disposed on top of an insulating layer on a bulk semiconductor substrate.

FIG. 5 is a side elevation view of the first and second resistors of FIG. 4 in a partially fabricated state further including a silicide block layer disposed over the polysilicon layer.

FIG. 8 is a side elevation view of the first and second resistors of FIG. 7 in a partially fabricated state wherein the silicide block layer has been etched to expose the polysilicon of the first resistor and second resistor in specific regions using photoresist as an etch mask.

FIG. 9 is a side elevation view of the first and second resistors of FIG. 8 in a partially fabricated state wherein the photoresist layer has been removed.

FIG. 13 is a top view of another example resistor according to an embodiment.

FIG. 14 is a cross-sectional view of the resistor of FIG. 13 taken along the line 14-14 in FIG. 13.

DETAILED DESCRIPTION

Figure 1:
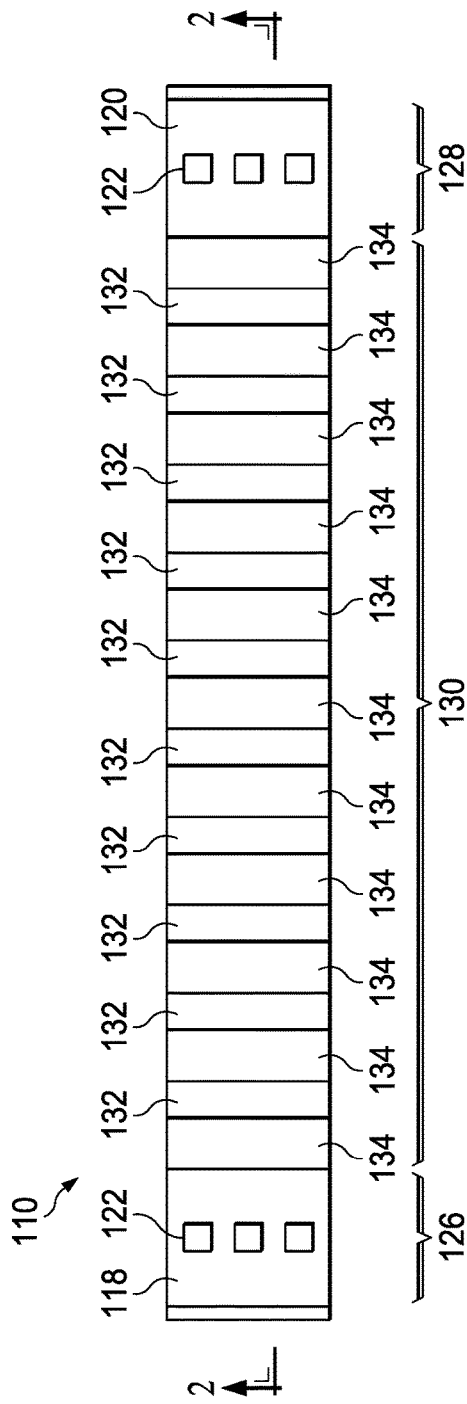
FIG. 1 is a top view of an example resistor according to an embodiment.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
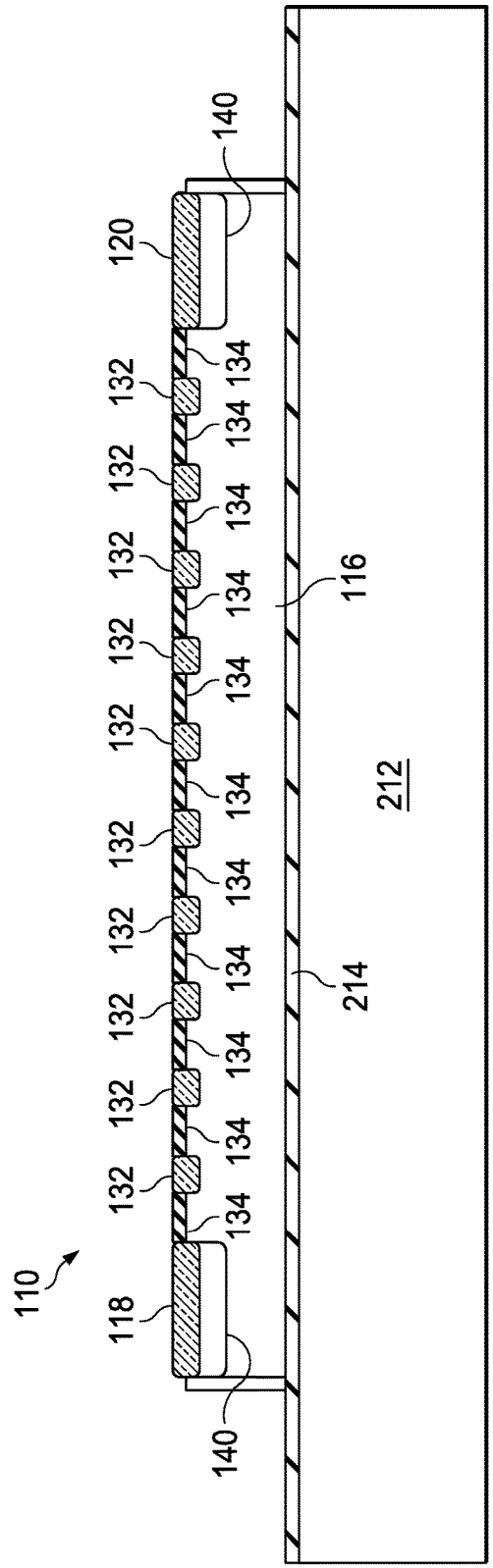
FIG. 2 is a cross-sectional view of the resistor taken along the line 2-2 in FIG. 1.

Referring initially to FIGS. 1-2, an example resistor is illustrated and identified generally by reference numeral 110. The resistor 110 generally includes a semiconductor substrate 212, an insulating layer 214 such as an oxide or the like, and a polysilicon layer 116 formed on top of the insulating layer 214. First and second silicide structures 118 and 120 are disposed adjacent respective first and second ends 126 and 128 of the polysilicon layer 116. Electrical contacts 122 are situated on the respective first and second silicide structures 118 and 120 for connecting the resistor to other electrical components in subsequently formed upper metallization layers (not shown) in a conventional fashion. Interposed between the first and second silicide structures 118 and 120 on an intermediate portion 130 of the polysilicon layer 116 are a plurality of intermediate silicide structures 132. The intermediate structures 132 are separate from each other and from the first and second silicide structures 118 and 120. The first and last silicide structures 118 and 120 in certain examples are implanted, such as during a CMOS source/drain processing step to form a low-ohmic end resistance, shown as implant regions 140 in FIG. 2.

As illustrated in FIGS. 1 and 2, the intermediate silicide structures 132 extend generally across the width of the polysilicon layer 116 in a similar fashion to end portions 118 and 120. In the illustrated example, the intermediate silicide structures 132 are generally coextensive in width, although not a requirement of all possible embodiments. In some embodiments, the intermediate silicide structures 132 can extend partially across the polysilicon layer 112. In still other embodiments, the intermediate silicide structures 132 can be grouped closer to one or the other of the structures 118 and 120. Any number of intermediate silicide structures 132 can be provided depending on the material and/or desired TCR of the resistor 110. The length of the intermediate silicide structures 132 can be varied along the length of the structure and the segments do not need to be of the same length.

It should be appreciated that the example resistor 110 with intermediate silicide structures 132 has a lowered TCR compared to a conventional resistor having only first and second silicide structures at respective ends thereof. In regions of the polysilicon layer 116 between the intermediate silicide portions 132, current traveling between the first and second end silicide structures 118 and 120 is forced to leave the low-ohmic silicide and travel across the interface into the polysilicon layer 116. This is a tunneling process and is enhanced by higher temperature. Thus, the interface between the silicide structures and the polysilicon has a lower resistivity at higher temperatures (i.e., a negative TCR). The TCR of the polysilicon layer 116 and the silicide will remain at their respective baselines, but the interface resistance of the silicide to polysilicon has a negative TCR. By selecting the length and number of silicided and unsilicided intermediate segments between the first and second silicide structures 118 and 120, the resistance and TCR of the resistor 110 can be adjusted over a wide range of values. Thus, if the polysilicon resistor material 116 has a positive TCR to begin with, a resistor with zero or negative TCR can be created by tailoring the intermediate silicide structures in accordance with the present disclosure. In general, the provision of the intermediate silicide portions 132 operates to decrease the TCR of the resulting resistor structure 110.

It should also be appreciated that the example resistor 110 can be fabricated with little or no additional cost or processing time in any fabrication process that includes both a polysilicon deposition step and a silicidation step.

Figure 3:
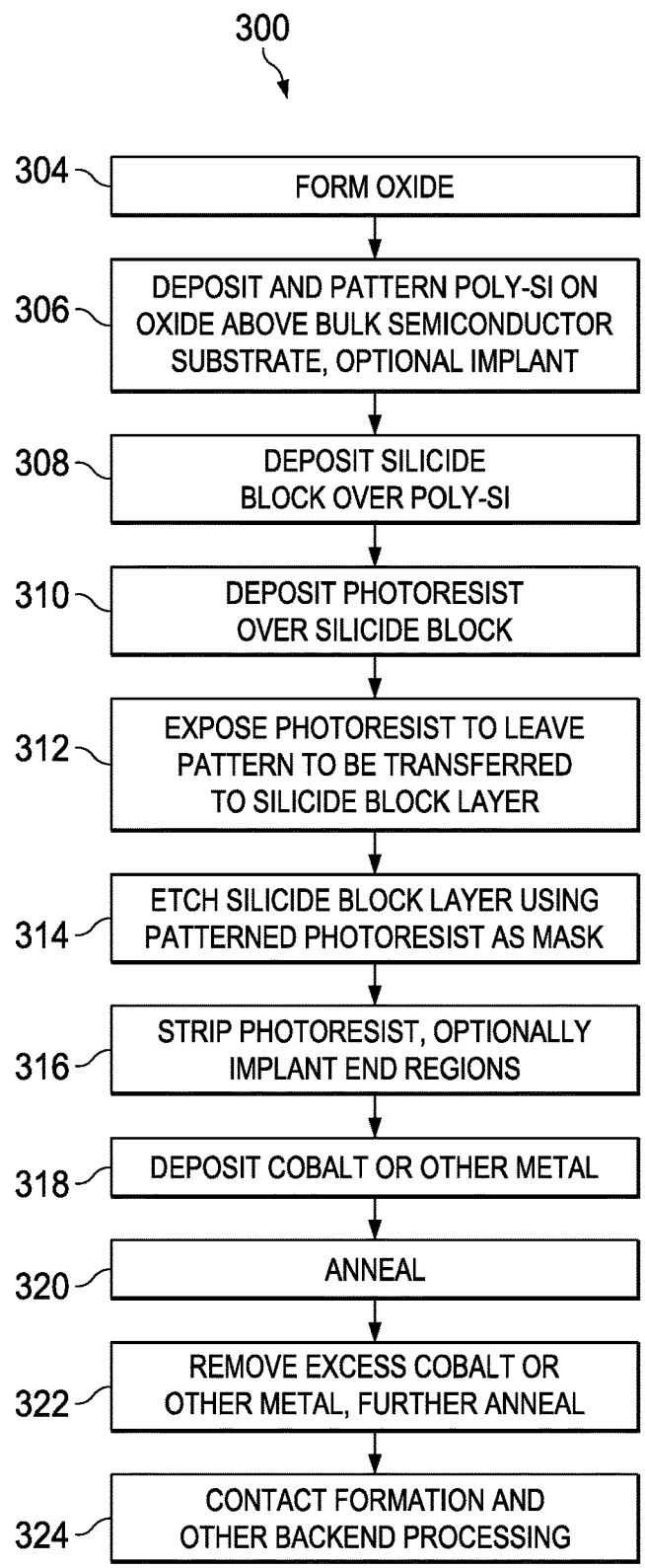
FIG. 3 is a flow diagram showing an example method of fabricating a resistor according to one embodiment.

Turning to FIG. 3, an example method 300 for making a resistor in accordance with the present disclosure is illustrated and identified generally by reference numeral 300. Method 300 will also be described in connection with FIGS. 4-12, which illustrate the example resistor 110 with intermediate silicide portions 132 at successive intermediate stages of fabrication. A second resistor 410 that does not include intermediate silicide portions is also illustrated in successive intermediate stages of fabrication in FIGS. 4-12. As will be appreciated, both resistors 110 and 410 can be fabricated alongside each other in a common process if desired, such as method 300.

The method in FIG. 3 begins with process step 304, where an insulating layer is formed on a bulk semiconductor substrate. The bulk semiconductor substrate can be a silicon (Si) substrate, although aspects of the disclosure can be carried out in association with SOI wafers, epitaxial silicon layers formed over silicon wafers, and any other semiconductor body including III-V materials. The bulk semiconductor substrate can be a monocrystalline Si substrate, or an epitaxially grown Si layer on top of a single crystal Si substrate, for example. The bulk substrate can have an implant (e.g. well). The semiconductor material could also be another polysilicon layer if the process offers a double poly stack (e.g. double poly in analog or BiCMOS process). The insulating layer can be any suitable material such as an oxide or the like, including a gate oxide or field oxide. In one example, the insulating layer includes a thermally grown $SiO_2$ oxide 516 or any other dielectric material formed by any suitable technique. Example insulating materials include one or more of $SiO_2$, SiON, high-k dielectrics, and stacks or combinations thereof, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and bilayered perovskite system material such as strontium bismuth tantalate, bismuth titanate and others.

In process step 306, polysilicon is deposited on the oxide above the bulk semiconductor substrate and patterned by a process 402 to form silicon structures 116, as shown in FIG. 4. The deposition and patterning of the polysilicon can be performed in a shared process with the patterning of polysilicon to form gate structures for NMOS and PMOS transistors (not shown), for example. Further, in some examples, the polysilicon 116 can be undoped, in-situ doped, or doped in a subsequent implant step. In one example, the polysilicon 116 is doped with p-type or n-type dopants. Doping of the polysilicon may be accomplished using any suitable technique within the scope of the disclosure, including direct implantation and/or diffusion. In one example, diffusion is employed wherein an implantation process provides p-type or n-type dopants to the polysilicon, thereby creating p-doped or n-doped polysilicon. An anneal process is then performed to diffuse the dopants in certain examples. Doping may also be performed in a shared process with the doping of, for example, gate structures of transistors being constructed elsewhere on the substrate 212.

The doping level of the material at the metallic contact interface can be greater than 1E18 cm-3 for Si/GaAs/InP with bandgap voltage around 1 eV (may be different for high bandgap material such as SiC or GaN), else the contact forms a Schottky diode and has non-linear current-voltage behavior. The doping level of the material further away than a depletion length can be lower doped than 1E18 cm-3 to fit the need of the resistor, typically in the 1E15 to 1E20 cm-3 range.

In one example, the regions 140 are implanted as shown in FIG. 9, for example, using an implantation process (not shown) concurrently used to implant n and p type source/drain structures in transistors of the IC. For instance, the prospective end regions 116 and 118 can receive the source/drain implant if part of a CMOS process.

In process step 308, a silicide block 134 is applied over the polysilicon structures 116 and insulating layer 214, for example, using a deposition process 502 in FIG. 5. The silicide block 134 can be any suitable material for blocking the formation of silicide, and typical includes a combination of oxide and/or nitride.

Figure 6:
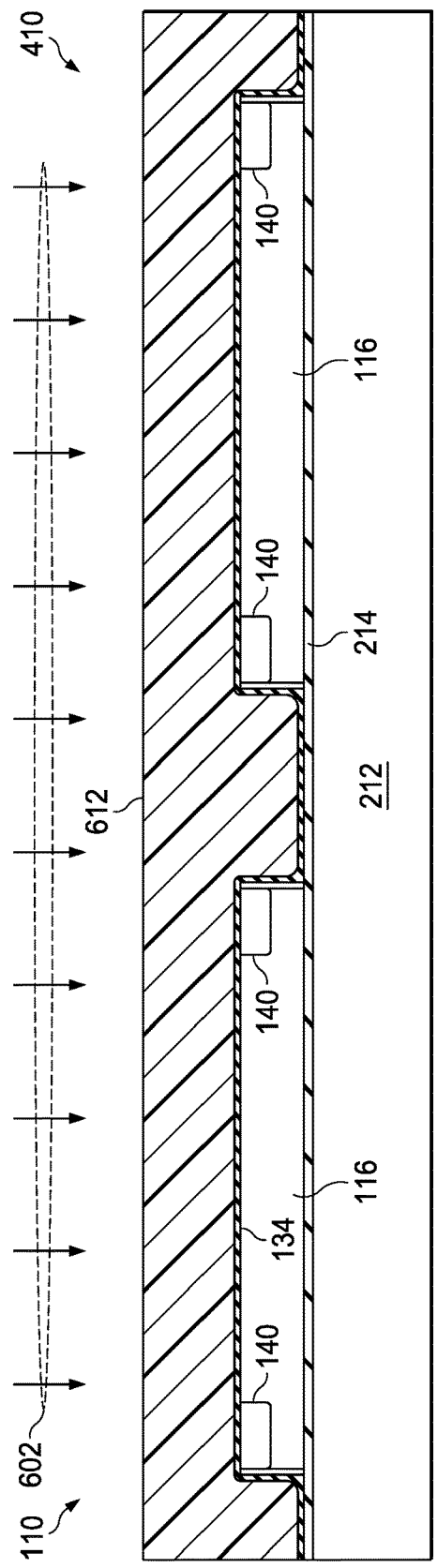
FIG. 6. is a side elevation view of the first and second resistors of FIG. 5 in a partially fabricated state further including a photoresist layer.

In process step 310, a photoresist 612 is applied over the silicide block 134, as shown by a deposition process 602 in FIG. 6.

Figure 7:
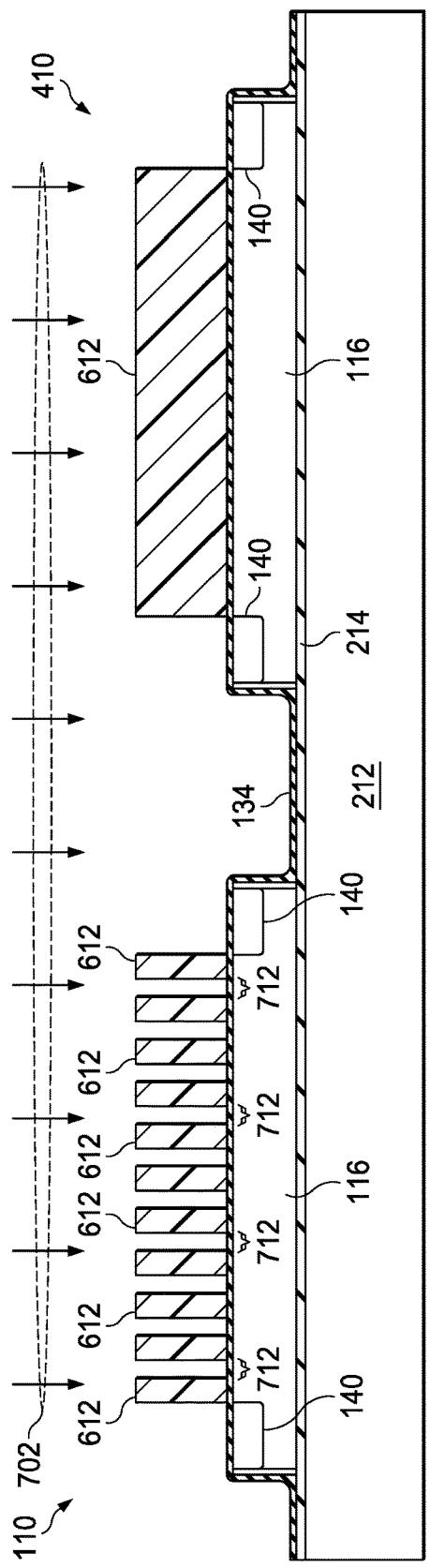
FIG. 7 is a side elevation view of the first and second resistors of FIG. 6, wherein the photoresist layer has been patterned.
Figure 10:
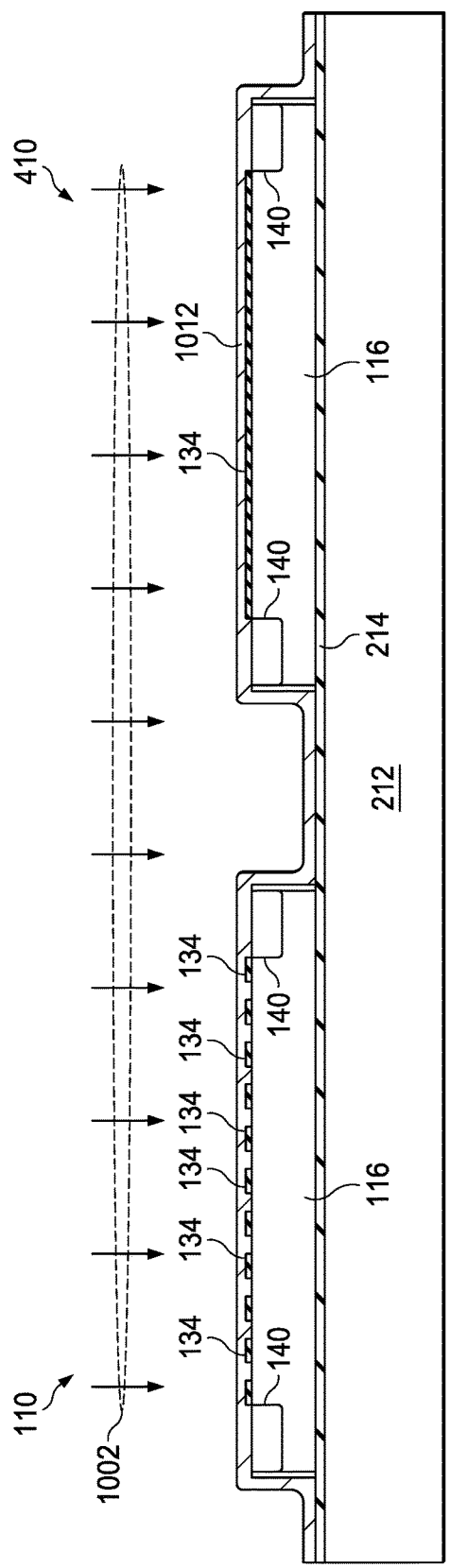
FIG. 10 is a side elevation view of the first and second resistors of FIG. 9 in a partially fabricated state further including a metal layer deposited over the polysilicon and remaining silicide block layers.

In process step 312, the photoresist 612 is exposed to leave a pattern to be transferred to the silicide block layer 134, as shown by process 702 in FIG. 7. In the illustrated example, the photoresist 612 is patterned to expose a plurality of strips 712 of the silicide block layer 134 over the polysilicon structure 116 of resistor 110, as well as portions of the silicide block layer 134 over the ends of the polysilicon structure 116. The photoresist is not patterned over the resistor 410 except to expose regions of the silicide block layer 134 over ends of the polysilicon layer 116.

In process step 314, the silicide block layer 134 is etched to remove portions thereof not covered by the remaining photoresist 612, as shown by process 802 in FIG. 8. The silicide block layer 134 is removed from the polysilicon layer 116 and/or any other location not covered by the photoresist 612. This exposes the polysilicon layer 116 in areas to be silicided, while leaving regions of the polysilicon structures 116 blocked from silicide formation by silicide block layer 134. For resistor 110, the regions to be silicided include the prospective locations of the first and second silicide structures 118 and 120 and the plurality of intermediate structures 132 shown in FIGS. 1 and 2. For resistor 410, the regions to be silicided include first and second silicide structures 1118 and 1120 (see FIG. 12).

In process step 316, the remaining photoresist is removed, as shown by process 902 in FIG. 9 and appropriate surface cleans are done. In process step 318, a metal layer 1012 is deposited over the polysilicon structures 116 and remaining silicide block 134, using a deposition process 1002 in FIG. 10. The metal layer 1012 can be cobalt or nickel, for example, or any other metal suitable for silicide formation.

Figure 11:
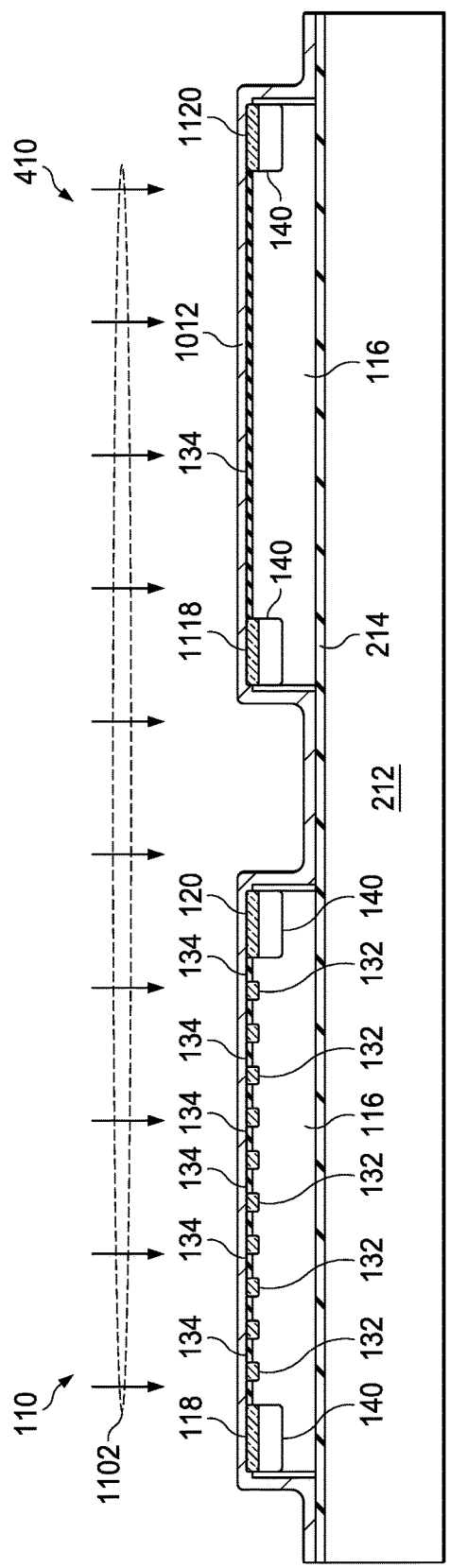
FIG. 11 is a side elevation view of the first and second resistors of FIG. 10 in a partially fabricated state undergoing an annealing process to form silicide structures where the metal layer is in contact with the polysilicon layer.

In process step 320, the assembly undergoes a silicidation step whereat silicide is formed at the interface of the polysilicon layer and the metal layer through an annealing process 1102 in FIG. 11. As will be appreciated, silicide is prevented from forming in the regions where the silicide block layer 134 exists. As such, resistor 110 includes silicide end structures 118 and 120, and a plurality of intermediate silicide structures 132 spaced from one another by the interleaved block structures 134. Resistor 410 includes only silicide end structures 1118 and 1120.

Figure 12:
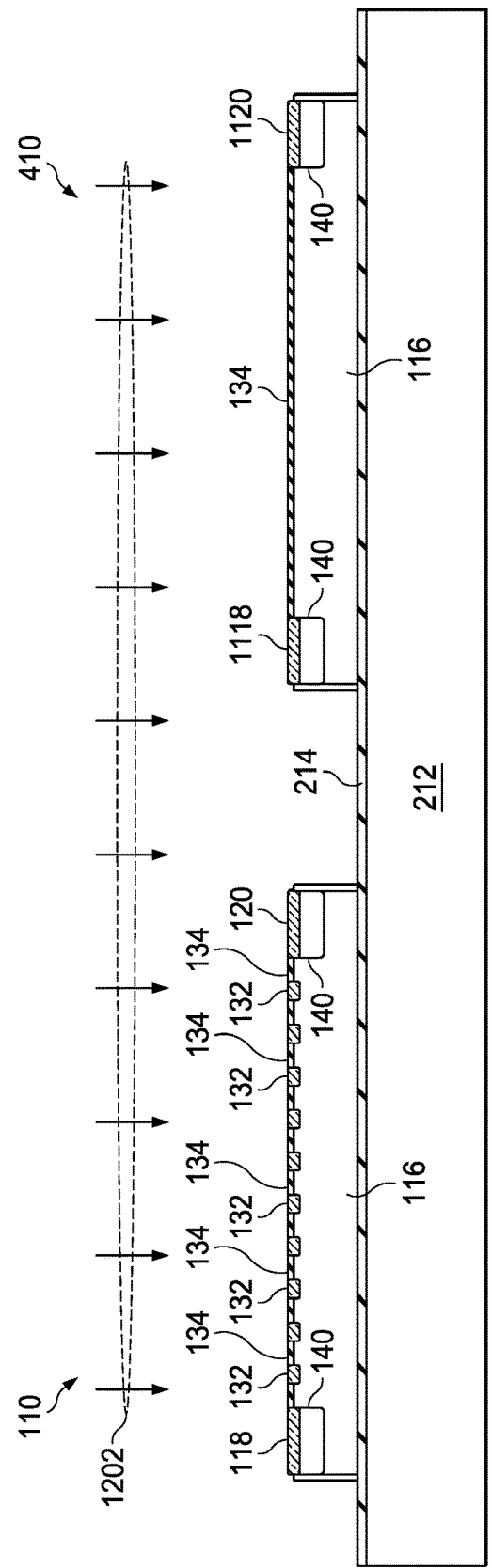
FIG. 12 is a side elevation view of the first and second resistors of FIG. 11 in a partially fabricated state after silicide formation wherein excess metal has been removed.

In process step 322, excess metal 1012 is removed, as shown by process 1202 in FIG. 12.

In the illustrated example, a further annealing step is performed at 322 to complete the silicide formation. An optional implant may be performed at this step to modulate the contact resistance of the silicide. Resistors 110 and 410 are now ready for contact formation and other back-end processing, at 324 in FIG. 3 which can include, for example, the formation of a top oxide layer and/or formation of contacts in the end silicide structures.

A further optional process step can include doping via implantation through the silicide structures 118, 120, 132 to modify the response of the interface resistance between the silicide and the polysilicon 212. This increases the doping level just at the metal semiconductor interface and can assist electron transport through the interface.

It should be appreciated that the silicide structures of the disclosed examples can be formed by any suitable silicide formation techniques. In one possible implementation, a nitride mask is formed and patterned to expose portions of the polysilicon, and cobalt or other suitable metal is deposited so as to contact the exposed portions of the polysilicon. The polysilicon and metal are then heated (e.g., 800-900° C.) to react the polysilicon with the deposited metal to form the silicide structure, to a thickness of about several hundred angstroms in one possible implementation. In another possible implementation, the silicide structures are formed (e.g., Titanium Silicide $TiSi_2$, or Tungsten Silicide $WSi_x$) by chemical vapor deposition (CVD) using monosilane or dichlorosilane with tungsten hexafluoride as source gases, followed by annealing at 800-900° C. to create conductive stoichiometric silicide structures. In another possible implementation, titanium or tungsten metal is sputter deposited onto the polysilicon and remaining silicide block and is then heated to a certain temperature (e.g., 800-900° C.) to react the polysilicon with the deposited metal to form the silicide structures, preferably to a thickness of about several hundred angstroms. In materials not suitable for silicide formation such as III-V a metal stack using suitable metals such as Ti, Pt, Pd, W, Ni or Au may be used. Also, a chemical mechanical polishing (CMP) process may be performed to create a smooth surface appropriate for wafer bonding.

In another example, particularly when using III-IV materials and/or in CMOS or other processing where a silicide block layer typically is not used, a photoresist lift-off process can be used for patterning a metal layer on the semiconductor substrate. In such process, an undercut photoresist is typically applied to the semiconductor substrate and patterned to expose specific portions of the semiconductor substrate. A metal is then deposited over the photoresist and semiconductor substrate. The photoresist and upper layer of the metal is removed leaving behind only the portions of the metal layer in contact with the semiconductor substrate. Then, an annealing process is used to create metal-semiconductor compound structures on the semiconductor substrate.

It should now be appreciated that resistor 110 can be fabricated using steps common to the fabrication of a resistor, such as resistor 410, that does not include the intermediate silicide portion through etching of the photoresist in additional regions to leave a pattern that blocks silicide formation in certain intermediate regions in addition to the end regions of the resistor. Additionally, or in the alternative, example resistor 110 can be fabricated alongside a transistor in shared process steps including polysilicon deposition and patterning, oxide formation, masking/etching, and silicidation steps. As such, the present disclosure sets forth a low or zero cost adding method of fabricating low or zero TCR resistors in fabrication processes that include at least a polysilicon deposition step and a silicidation step.

With reference to FIGS. 13 and 14, another example resistor in accordance with the present disclosure is illustrated and identified generally by reference numeral 1310. In this example, the resistor 1310 is formed in a bulk semiconductor substrate 1312, as opposed to the polysilicon resistor 110 of FIGS. 1 and 2. In general, resistor 1310 is formed in a process similar to the above-described method 300, with the exception that instead of depositing and patterning a polysilicon structure on a semiconductor substrate, a resistor region is isolated in the semiconductor substrate and then the silicide structures are formed directly on the isolated resistor region.

To this end, it will be appreciated that the resistor 1310 includes a resistor region 1314 of the semiconductor substrate 1312 that is isolated from the remainder of the semiconductor substrate 1312. The semiconductor substrate 1310 can be a silicon substrate, although aspects of the disclosure can be carried out in association with SOI wafers, epitaxial silicon layers formed over silicon wafers, and any other semiconductor body including III-V materials. The bulk semiconductor substrate can be plain Si substrate, or an epitaxially grown Si layer on top of a plain Si substrate, for example. The bulk substrate could have received an implant (e.g. well). The resistor region 1314 can be formed by, for example, an oxide structure 1316 surrounding the resistor region 1314 (e.g., LOCOS or shallow trench isolation (STI)), or by various other isolation techniques such as junction isolation. The resistor 1310 includes first and second silicide end structures 1318 and 1320, and a plurality of intermediate silicide structures 1332. The semiconductor material beneath the end structures 1318 and 1320 can be doped, as shown in regions 1340 in FIG. 14. In one example, the regions 1340 are doped during source/drain implant process steps used in making transistors (not shown) in the IC. It should be appreciated that the formation of the first and second silicide end structures 1318 and 1320, and plurality of intermediate silicide structures 1332 on the semiconductor substrate 1312 can be performed in the manner previously described in connection with the example of FIGS. 1-12, and the resistor structure 1310 can include interleaved remaining silicide block layer structures 1334 as shown in FIGS. 13 and 14.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A resistor, comprising:
a semiconductor structure having a length dimension with first and second ends spaced from one another and an intermediate region between the first and second ends, the semiconductor structure being void of PN junctions;
first and second doped regions within the semiconductor structure proximate the first and second ends of the semiconductor structure;
first and second metal-semiconductor compound structures on the semiconductor structure proximate the first and second ends of the semiconductor structure, the first and second metal-semiconductor compound structures being spaced apart from each other along the length dimension of the semiconductor structure; and
at least one intermediate metal-semiconductor compound structure on a portion of the intermediate region of the semiconductor structure between the first and second ends, the intermediate metal-semiconductor compound structure having a depth less than a depth of the first and second doped regions, and the intermediate metal-semiconductor compound structure being spaced apart from the first and second metal-semiconductor compound structures on the semiconductor structure.

2. The resistor of claim 1, wherein the semiconductor structure includes polysilicon.

3. The resistor of claim 1, wherein the semiconductor structure includes silicon, and wherein the metal-semiconductor compound includes a silicide.

4. The resistor of claim 3, wherein the silicide includes cobalt, titanium, nickel or nickel-platinum silicide.

5. The resistor of claim 1, comprising a plurality of metal-semiconductor structures spaced apart from one another and from the first and second metal-semiconductor structures along the intermediate region of the semiconductor structure.

6. The resistor of claim 5, wherein the plurality of metal-semiconductor structures are evenly spaced apart from one another.

7. The resistor of claim 1, wherein the first and second metal-semiconductor structures and the at least one intermediate metal-semiconductor structure extend across a width of the semiconductor structure.

8. The resistor of claim 7, wherein the first and second metal-semiconductor structures and the at least one intermediate metal-semiconductor structure are coextensive across a width of the semiconductor material.

9. A method of fabricating a resistor, the method comprising:
forming a polysilicon structure on a substrate, the polysilicon structure including first and second ends spaced from one another and an intermediate region between the first and second ends, the polysilicon structure being void of PN junctions;
forming first and second doped regions within the semiconductor structure proximate the first and second ends of the semiconductor structure;
forming first and second silicide structures on the polysilicon structure proximate the first and second ends of the polysilicon structure, the first and second silicide structures being spaced apart from each other on the polysilicon structure; and
forming at least one intermediate silicide structure on a portion of the intermediate region of the polysilicon structure between the first and second ends, the intermediate metal-semiconductor compound structure having a depth less than a depth of the first and second doped regions, and the at least one intermediate silicide structure being spaced apart from the first and second silicide structures on the polysilicon structure.

10. The method of claim 9, wherein the first and second silicide end regions and the at least one intermediate silicide region are formed concurrently.

11. The method of claim 1, wherein the forming the first and second silicide structures on the first and second ends of the polysilicon structure includes:
depositing a silicide block layer over the polysilicon structure;
patterning the silicide block layer to expose the first and second ends of the polysilicon structure and to expose at least one intermediate portion of the intermediate region spaced from the first and second ends;
depositing a metal layer over the polysilicon structure and remaining silicide block layer; and
annealing the metal layer and the exposed portions of the polysilicon structure to form silicide at an interface of the metal layer and the polysilicon structure.

12. The method of claim 11, wherein patterning the silicide block layer includes:
depositing a photoresist layer over the silicide block layer;
patterning the photoresist layer to expose at least a portion of the silicide block layer above the first and second ends of the polysilicon structure at locations which the first and second silicide structures are to be formed, and to expose the intermediate portion of the intermediate region spaced from the first and second ends at which the intermediate silicide structure is to be formed;
removing the exposed portions of the silicide block layer using the photoresist as a mask to expose the first and second ends of the polysilicon layer and to expose the intermediate portion of the intermediate region; and
removing the photoresist.

13. A resistor comprising:
a resistor region of a semiconductor substrate, the resistor region having a length dimension with first and second ends spaced from one another and an intermediate region between the first and second ends, the resistor region being void of PN junctions;
an oxide structure formed on or in the semiconductor substrate surrounding the resistor region of the semiconductor substrate;
first and second doped regions within the semiconductor structure proximate the first and second ends of the semiconductor structure;
first and second metal-semiconductor compound structures on the first and second ends of the resistor region, the first and second metal-semiconductor compound structures being spaced apart from each other along the length dimension of the resistor region; and
at least one intermediate metal-semiconductor compound structure on a portion of the intermediate region of the resistor region between the first and second ends, the intermediate metal-semiconductor compound structure having a depth less than a depth of the first and second doped regions, and the at least one intermediate metal-semiconductor compound structure being spaced apart from the first and second metal-semiconductor compound structures on the resistor region of the semiconductor substrate.

14. The resistor of claim 13, wherein the semiconductor substrate includes silicon, and wherein the metal-semiconductor compound includes a silicide.

15. The resistor of claim 14, wherein the silicide includes cobalt silicide.

16. The resistor of claim 14, wherein the semiconductor substrate includes monocrystalline silicon.

17. The resistor of claim 14, wherein the semiconductor structure includes epitaxial silicon.

18. The resistor of claim 13, wherein the at least one intermediate metal-semiconductor structure includes a plurality of metal-semiconductor structures spaced apart from one another and from the first and second metal-semiconductor structures along the length of the resistor region.

19. The resistor of claim 18, wherein the plurality of metal-semiconductor structures are evenly spaced apart from one another.

20. The resistor of claim 18, wherein the first and second metal-semiconductor structures and the at least one intermediate metal-semiconductor structure extend across a width of the resistor region.

* * * * *